(12) United States Patent
Ku et al.

(10) Patent No.: US 8,246,382 B1
(45) Date of Patent: Aug. 21, 2012

(54) BENDABLE PATCH PANEL STRUCTURE

(75) Inventors: Ying-Ming Ku, Taoyuan (TW); Chun-Chieh Chen, Taoyuan (TW)

(73) Assignee: YFC-Boneagle Electric Co., Ltd., Taoyuan (TW)

( * ) Notice: Subject to any disclaimer, the term of this patent is extended or adjusted under 35 U.S.C. 154(b) by 0 days.

(21) Appl. No.: 13/161,839

(22) Filed: Jun. 16, 2011

(51) Int. Cl.
   *H01R 13/66* (2006.01)
(52) U.S. Cl. .................................. 439/540.1
(58) Field of Classification Search ........... 439/49, 439/540.1, 540.5, 719; 385/55, 134, 135
   See application file for complete search history.

(56) References Cited

U.S. PATENT DOCUMENTS

| | | | |
|---|---|---|---|
| 6,918,786 B2 * | 7/2005 | Barker et al. | 439/540.1 |
| 6,971,909 B2 * | 12/2005 | Levesque et al. | 439/540.1 |
| 7,094,095 B1 * | 8/2006 | Caveney | 439/540.1 |
| 7,207,835 B2 * | 4/2007 | Levesque et al. | 439/540.1 |
| 7,637,773 B2 * | 12/2009 | Shifris et al. | 439/540.1 |

* cited by examiner

*Primary Examiner* — Khiem Nguyen
(74) *Attorney, Agent, or Firm* — Chun-Ming Shih; HDLS IPR Services

(57) ABSTRACT

A bendable patch panel structure installed on a chassis includes a patch panel and a fixing element. The patch panel includes a first panel, a second panel, a hinge pivotally coupled between ends of the first and second panels, and a connecting plate separately installed at other ends of the first panel and second panel and pivotally coupled to the chassis. After the first and second panels are bent and adjusted, a fixing element for the appropriate connection is selected according to the shape of the two unfolded metal plates of the hinge, such that the installer can adjust the bending condition of the patch panel in a time-saving, effort-saving, quick and easy manner.

11 Claims, 11 Drawing Sheets

US 8,246,382 B1

BENDABLE PATCH PANEL STRUCTURE

FIELD OF THE INVENTION

The present invention relates to a patch panel, in particular to a bendable patch panel structure.

BACKGROUND OF THE INVENTION

At present, a patch panel is generally installed and used in a telecommunication chassis, and a connector of the patch panel is provided for connecting a plurality of plugs of many signal transmission lines to transmit signals of an electronic device installed to the telecommunication chassis.

With reference to FIG. 1 for a conventional patch panel 10, the patch panel 10 comprises a first panel 101, a second panel 102, and a hinge 103 pivotally coupled to the first panel 101 and the second panel 102. A screw 104 is installed separately to an end of the first panel 101 and the second panel 10. The first panel 101 and the second panel 102 are secured to a slender screw hole 203 separately formed on a fixing plate 202 at a frame rim 201 on both sides of the chassis 20 by the screws 104. If it is necessary to adjust the bending angle of the first panel 101 and the second panel 102, the screws 104 are loosened and slid in the slender screw hole 203, such that the hinge 103 between the first panel 101 and the second panel 102 is operated to adjust the bending angle of the first panel 101 and the second panel 102. After the bending angle is adjusted, the screws are reinstalled and secured to complete the bending adjustment of the first panel 101 and the second panel 102.

Since a tool is required to loosen the screws 104 for making a bending adjustment of the first panel 101 and the second panel 102 and the tool is used again to reinstall the screws 104 after making the adjustment, the application of the patch panel is very inconvenient.

SUMMARY OF THE INVENTION

Therefore, it is a primary objective of the present invention to overcome the aforementioned shortcoming of the conventional patch panel by providing a patch panel structure with the patch panel pivotally coupled to the chassis, and a fixing element is selected for the connection according to the shape of the two unfolded metal plates of the hinge of the patch panel structure, after the patch panel is adjusted and bent, such that an installer can adjust the bending condition of the patch panel in a time-saving, effort-saving, quick and easy manner.

To achieve the aforementioned objective, the present invention provides a bendable patch panel structure, comprising:

a patch panel, including a first panel and a second panel installed thereon, a hinge pivotally coupled to ends of the first panel and the second panel, and a connecting plate installed on the chassis and pivotally coupled to other ends of the first panel and the second panel, wherein the hinge includes two metal plates and a plurality of pivots for pivotally coupling the two metal plates to the first panel and the second panel respectively, and each of the two metal plates has a notch formed thereon, and a fixing element, installed and coupled to the hinge; wherein the fixing element is made of rubber or plastic in a plate shape, and includes a recession formed on a pivoting portion for receiving the two and pivotally coupled metal plates, two connecting areas separately defined on both sides of the recession and attached on a side of the two metal plates, a T-shaped snap portion separately formed on the two connecting areas, and the snap portion being separately snapped into two notches of the two metal plates, a stop wall separately formed at edges of the two connecting areas, and a recess formed on the stop wall, and the stop wall and the recess are coupled to other pivoting portions of the two metal plates and the first and second panels.

To achieve the foregoing objective, the present invention further provides a bendable patch panel structure, comprising: a patch panel, including a first panel and a second panel installed thereon, a hinge pivotally coupled to ends of the first panel and the second panel, and a connecting plate installed on the chassis and pivotally coupled to other ends of the first panel and the second panel, wherein the hinge includes two metal plates and a plurality of pivots for pivotally coupling the two metal plates to the first panel and the second panel respectively, and each of the two metal plates has a notch formed thereon; and a fixing element, coupled to the hinge; wherein when the two metal plates are unfolded to an included angle equal to 30°, a V-shaped fixing element is coupled to the hinge, and the fixing element is made of rubber or plastic and includes a V-shaped protrusion protruded from a side of the fixing element, a connecting area separately defined on both sides of the protrusion, a T-shaped snap portion separately formed on the two connecting areas and snapped into the two notches, and a stop wall separately formed on a lateral edge of the two connecting areas, and the connecting area and the stop wall are attached on a side of the two metal plates.

To achieve the foregoing objective, the present invention further provides a bendable patch panel structure, comprising: a patch panel, including a first panel and a second panel installed thereon, a hinge pivotally coupled to ends of the first panel and the second panel, and a connecting plate installed on the chassis and pivotally coupled to other ends of the first panel and the second panel, wherein the hinge includes two metal plates and a plurality of pivots for pivotally coupling the two metal plates to the first panel and the second panel respectively, and each of the two metal plates has a notch formed thereon; and a fixing element, coupled to the hinge; wherein when the two metal plates are unfolded to an included angle equal to 15°, a triangular fixing element is coupled to the two metal plates, and the fixing element are made of rubber or plastic and includes a cone protruded from a side of the fixing element, a connecting area separately defined on both sides of the cone, a T-shaped snap portion separately formed on the two connecting areas and snapped into the two notches, and a stop wall separately formed at an lateral edge of two connecting areas, and the connecting area and the stop wall are attached onto a side of the two metal plates.

To achieve the foregoing objective, the present invention further provides a bendable patch panel structure, comprising: a patch panel, including a first panel and a second panel installed thereon, a hinge pivotally coupled to ends of the first panel and the second panel, and a connecting plate installed on the chassis and pivotally coupled to other ends of the first panel and the second panel, wherein the hinge includes two metal plates and a plurality of pivots for pivotally coupling the two metal plates to the first panel and the second panel respectively, and each of the two metal plates has a notch formed thereon; and a fixing element, coupled to the hinge; wherein the two metal plates are installed at positions parallel to each other, and a fixing element with an A-shaped end and another U-shaped end is installed to the two metal plates, and the fixing element is made of rubber or plastic and includes two side arms, a crossbeam formed between ends of the two side arms, such that an end of the fixing element is A-shaped and another end is U-shaped, and the two metal plates are included by the two side arms of the fixing element, and the crossbeam is installed across the two notches.

DESCRIPTION OF THE PREFERRED EMBODIMENTS

The technical characteristics and contents of the present invention will become apparent with the following detailed description and related drawings. The drawings are provided for the purpose of illustrating the present invention only, but not intended for limiting the scope of the invention.

Figure 1:
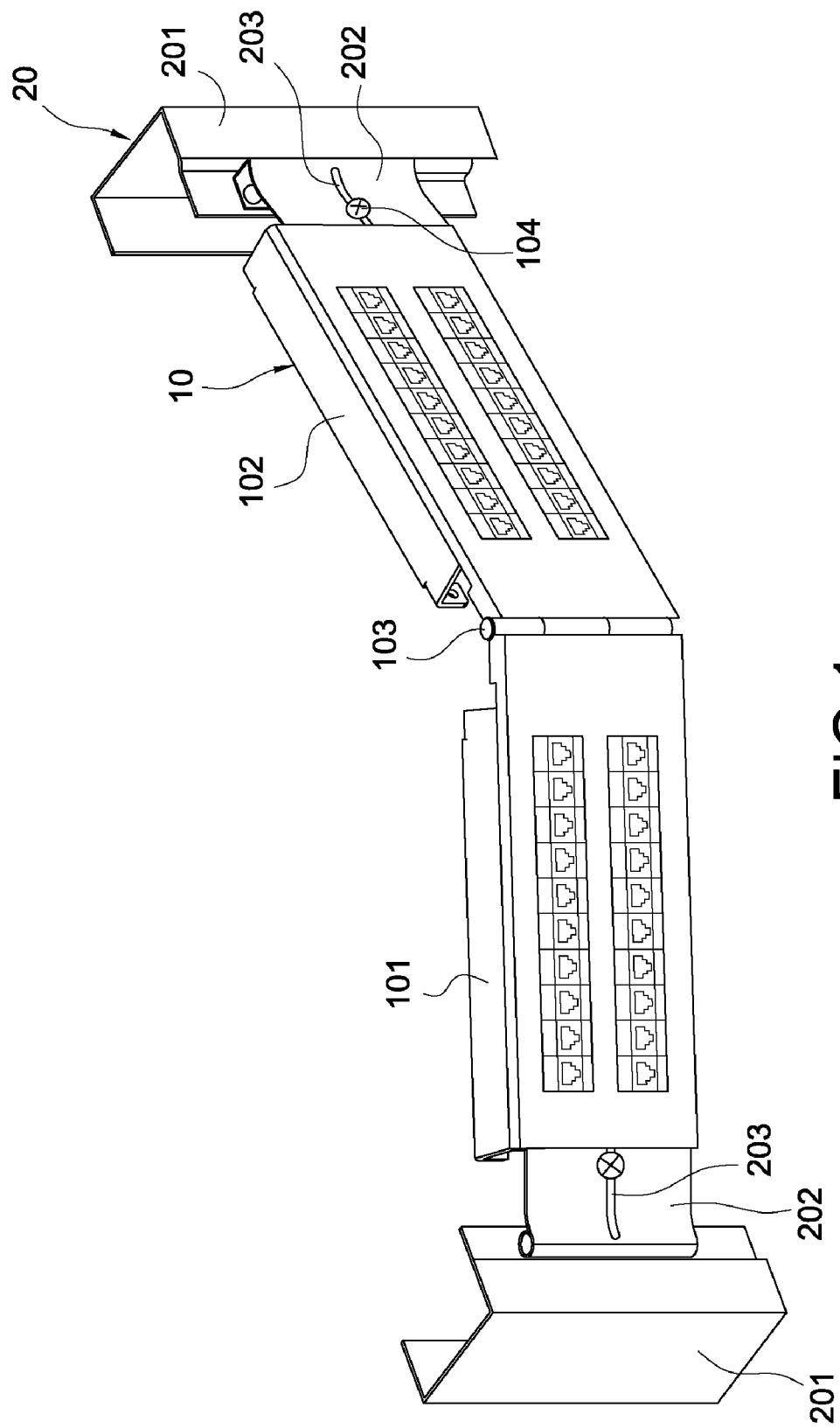
FIG. 1 is a schematic view of a conventional patch panel structure.
Figure 2:
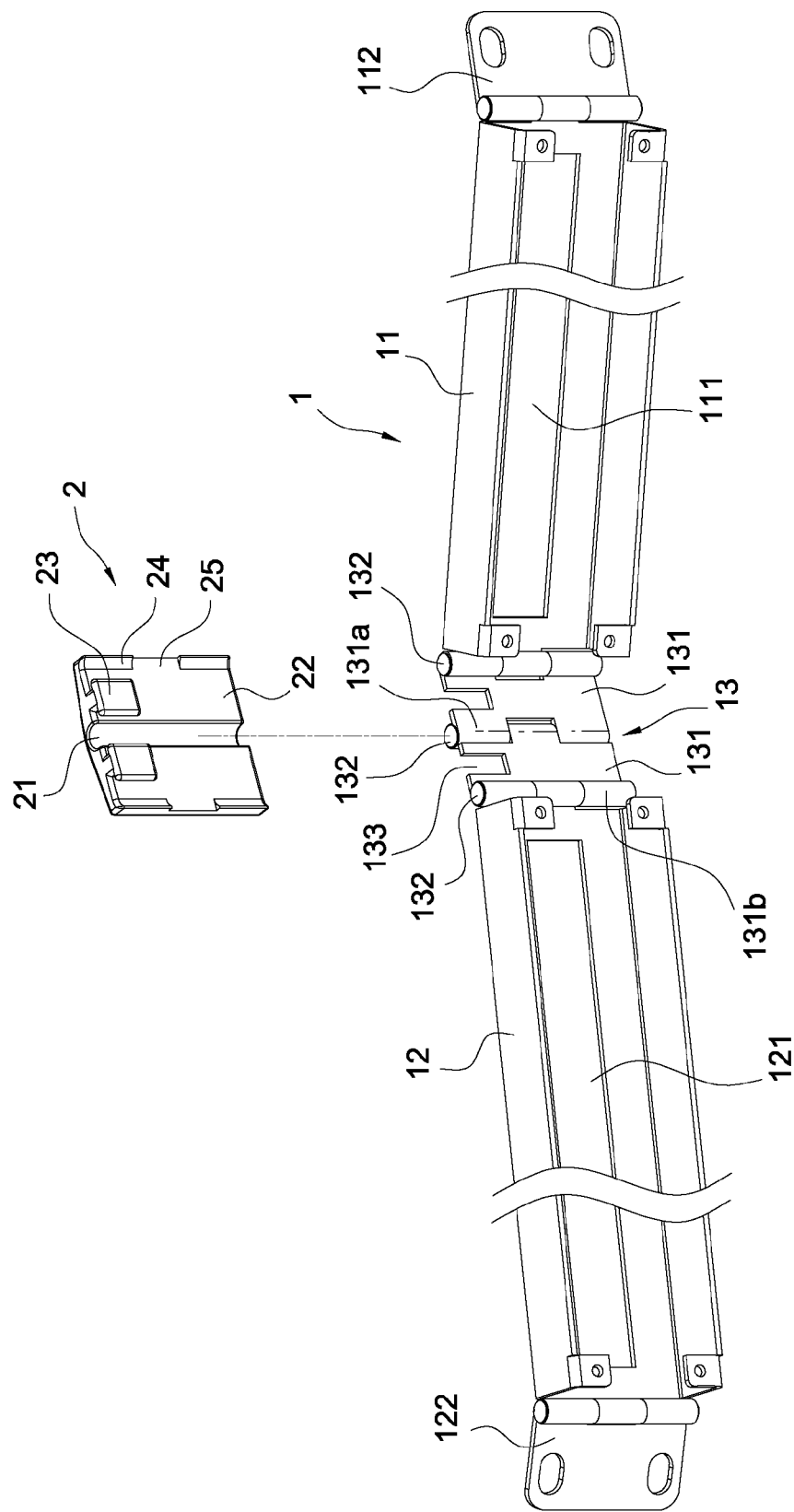
FIG. 2 is an exploded view of a patch panel structure of the present invention.
Figure 3:
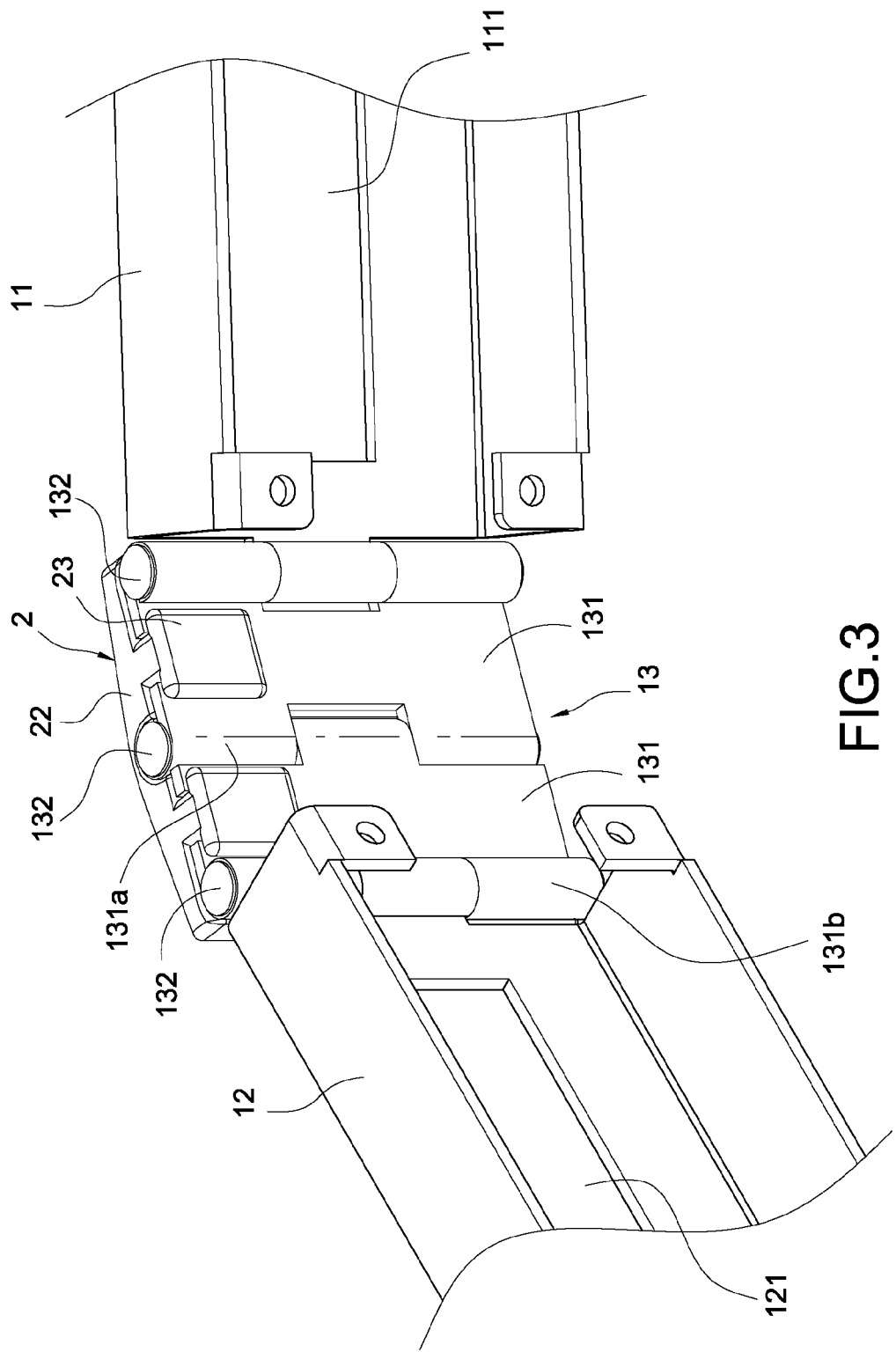
FIG. 3 is a perspective view of a patch panel structure of the present invention.

With reference to FIGS. 2 and 3 for an exploded view and a perspective view of a patch panel structure of the present invention, the bendable patch panel structure comprises a patch panel 1 and a fixing element 2.

The patch panel 1 is comprised of a first panel 11, a second panel 12 and a hinge 13 pivotally coupled to the first panel 11 and the second panel 12. The first panel 11 and the second panel 12 are in the shape of a long frame, and each of the first panel 11 and second panel 12 has an opening 111, 121 formed thereon for coupling a connector (not shown in the figure) of a communication system. In addition, a connecting plate 112, 122 is pivotally coupled to an end of the first and second panels 11, 12 and installed to the chassis (not shown in the figure). The hinge 13 includes two metal plates 131 and a plurality of pivots 132 pivotally coupled to the two metal plates 131 and the first panel 11 and the second panel 12, such that the patch panel can be bent, and each of the two metal plates 131 has a notch 133 formed thereon.

The fixing element 2 is made of rubber or plastic in a plate shape and latched onto the hinge 3, and includes a slender recession 21 formed on a side of the fixing element 2 for containing a pivoting portion 131a pivotally coupled to the two metal plates 131 of the hinge 13, and two connecting areas 22 defined on both sides of the recession 21 and attached onto surfaces of the two metal plates 131 respectively, and each of the two connecting areas 22 has a T-shaped snap portion 23, and the snap portion 23 is snapped into the two notches 133 of the two metal plates 131. In addition, a stop wall 24 is formed at an end of each of the two connecting areas 22 and includes a recess 25 formed thereon, and the stop wall 24 and the recess 25 are coupled to the two metal plates 131 and pivoting portions 131b of the first panel 11 and the second panel 12.

When the two metal plates 131 of the hinge 13 pivotally coupled to the first panel 11 and the second panel 12 are unfolded to a linear position or 180 degrees, the recession 21 formed on the plate-shaped fixing element 2 is coupled to the pivoting portion 131a of the two metal plates 131, the snap portion 23 is snapped into the two notches 133 of the two metal plates 131, and the two connecting areas 22 and the stop wall 24 are attached onto lateral surfaces of the two metal plates 131, and the fixing element 2 is used to limit the two metal plates 131 at a fixed position to achieve the fixing effect after the first panel 11 and the second panel 12 are bent.

Figure 4:
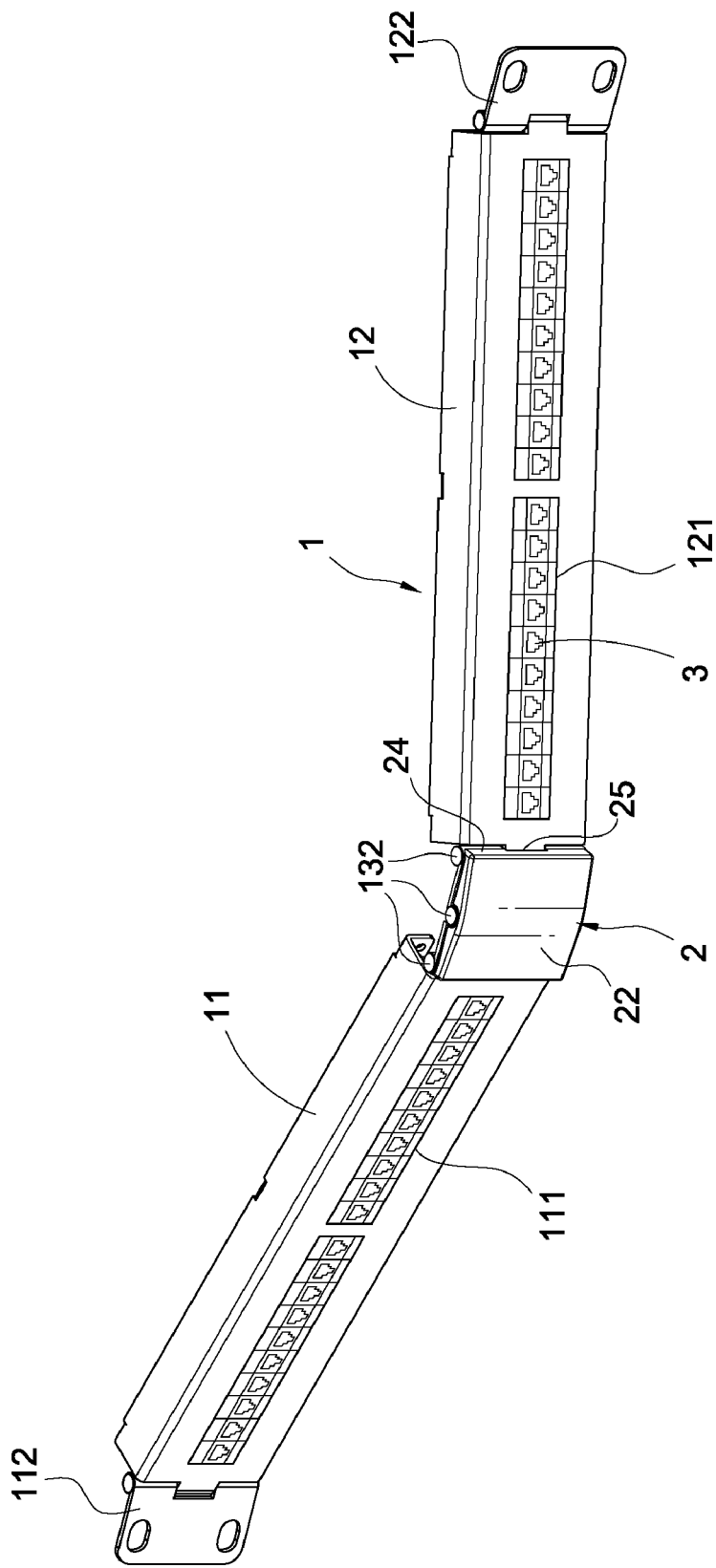
FIG. 4 is a schematic view of an application of the present invention.
Figure 5:
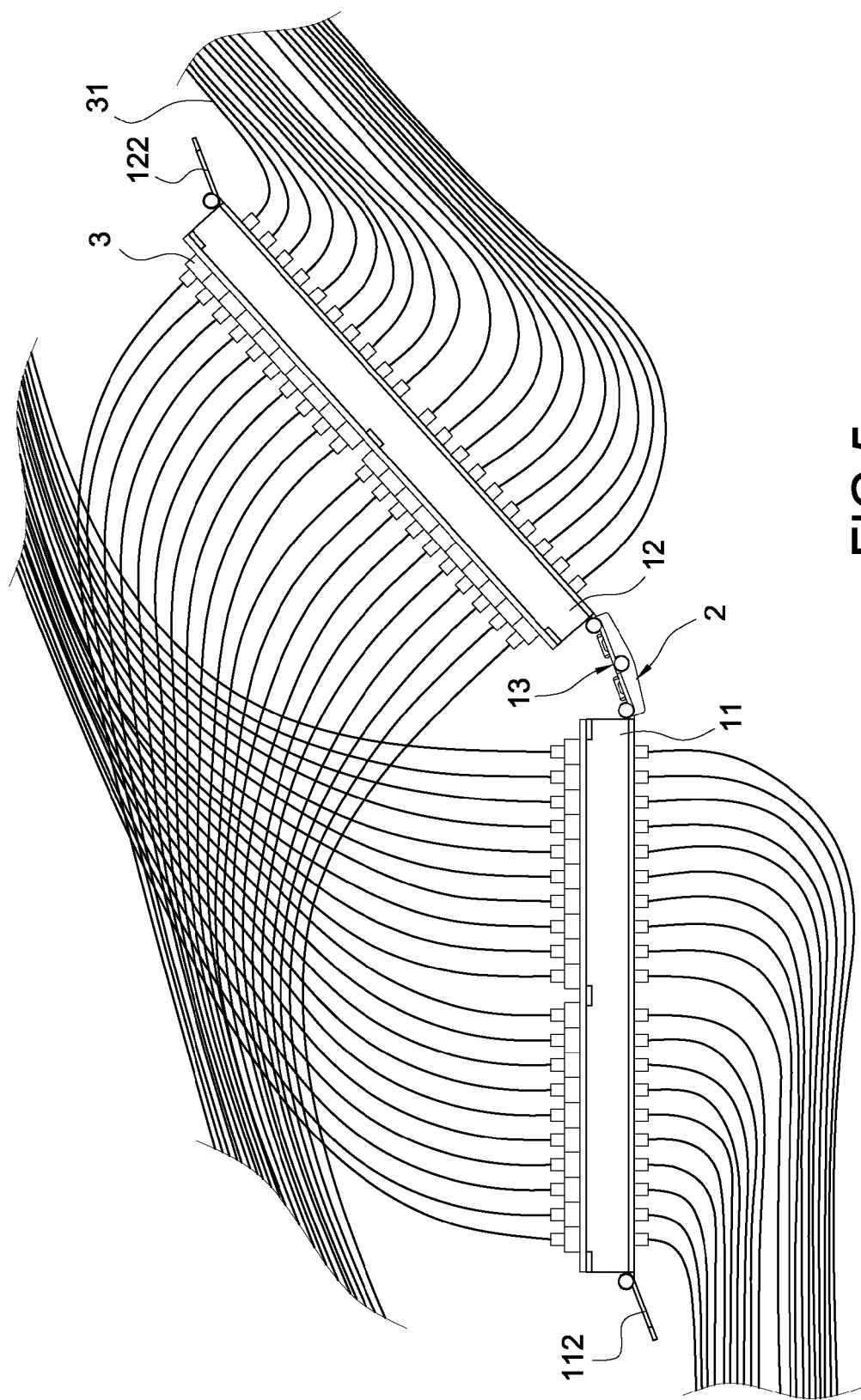
FIG. 5 is another schematic view of an application of the present invention.

With reference to FIGS. 4 and 5 for first and second schematic view of an application of the present invention respectively, openings 111, 121 are formed on the first and second panels 11, 12 of the patch panel respectively for installing a plurality of communication connectors 3, and the connectors 3 are provided for connecting to transmission lines 31 to achieve the effect of transmitting communication signals.

Figure 6:
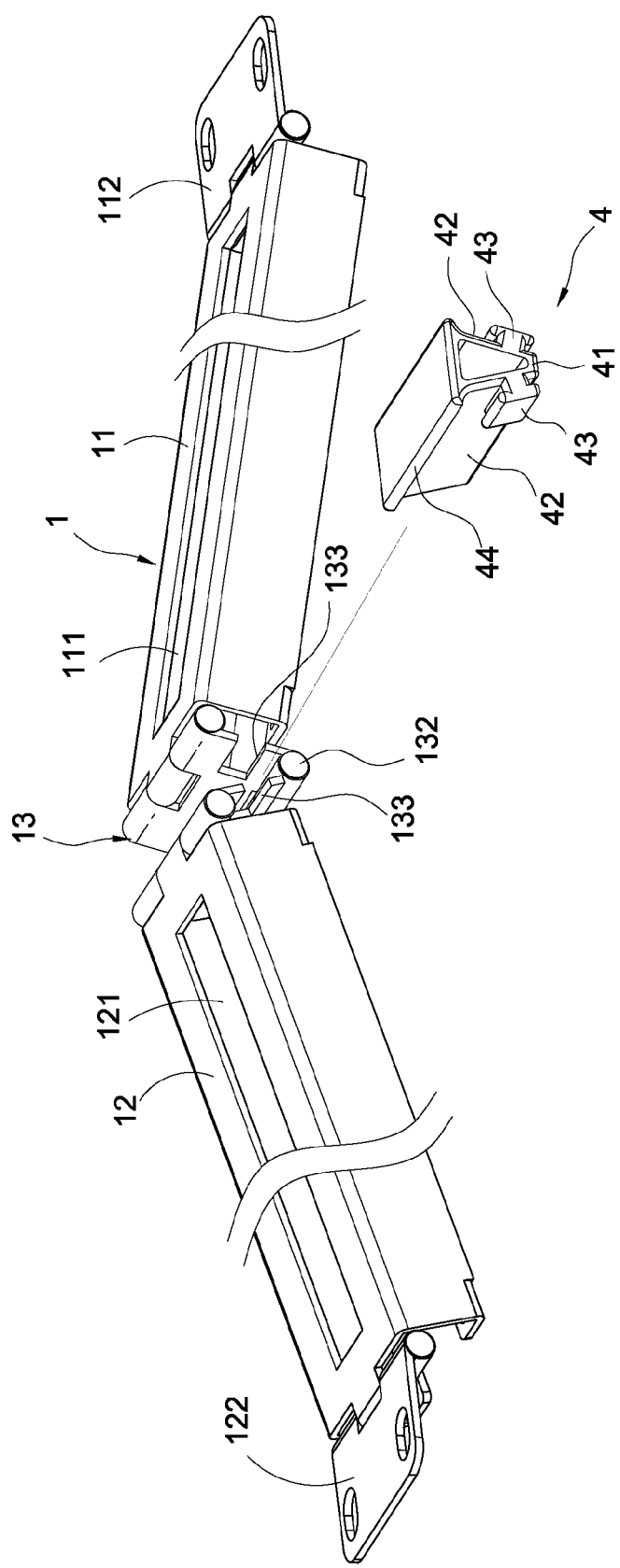
FIG. 6 is an exploded view of one embodiment of the present invention.
Figure 7:
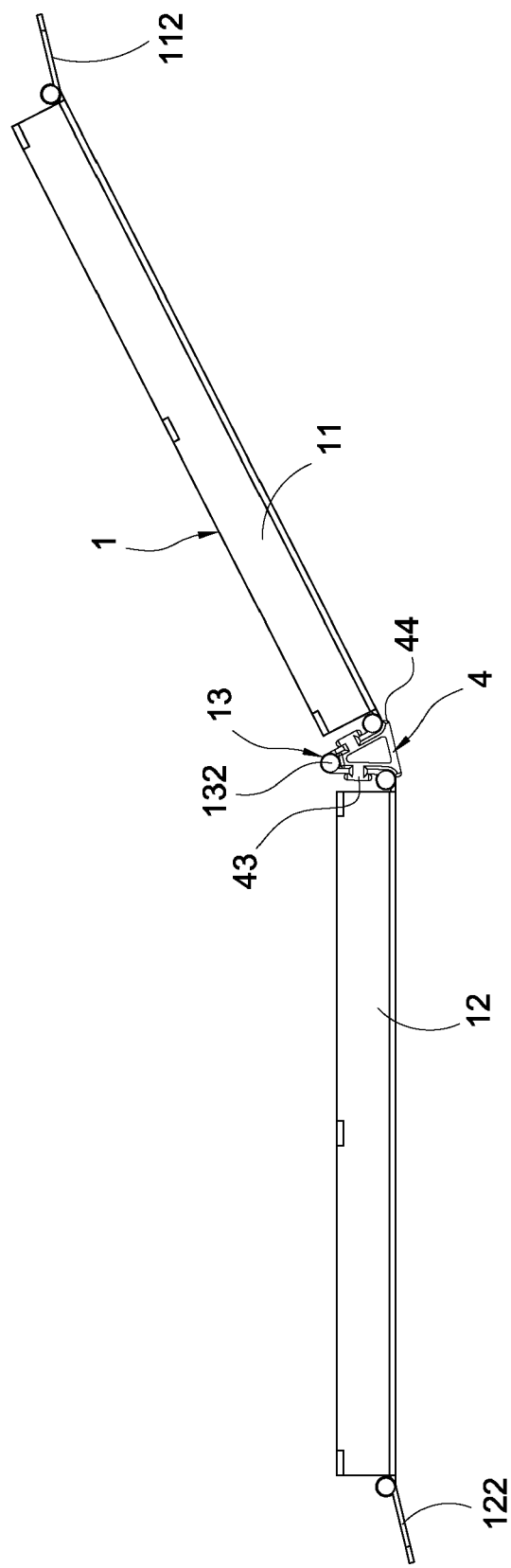
FIG. 7 is a perspective view of FIG. 6.

With reference to FIGS. 6 and 7 for an exploded view and a perspective view of another preferred embodiment of the present invention, after the connecting plate 112, 122 are used for adjusting the first panel 11 and the second panel 12 of the patch panel, and the two metal plates 131 of the hinge 13 are unfolded to an included angle equal to 30°, a V-shaped fixing element 4 made of rubber or plastic can be used for connecting and unfolding the two metal plates 131 of the hinge 13 to an included angle equal to 30°.

The fixing element 4 includes a V-shaped protrusion 41 protruded from a side of the fixing element 4, a connecting area 42 separately defined on both sides of the protrusion 41, a T-shaped snap portion 43 separately formed on the two connecting areas 42 and snapped into the two notches 133, and stop wall 44 separately formed on lateral edges of the two connecting areas 42, and the connecting area 42 and the stop wall 44 are attached onto surfaces of the two metal plates 131 to limit the two metal plates 131 of the fixing element 4 at a fixed position to achieve the fixing effect after the first panel 11 and the second panel 12 are bent.

Figure 8:
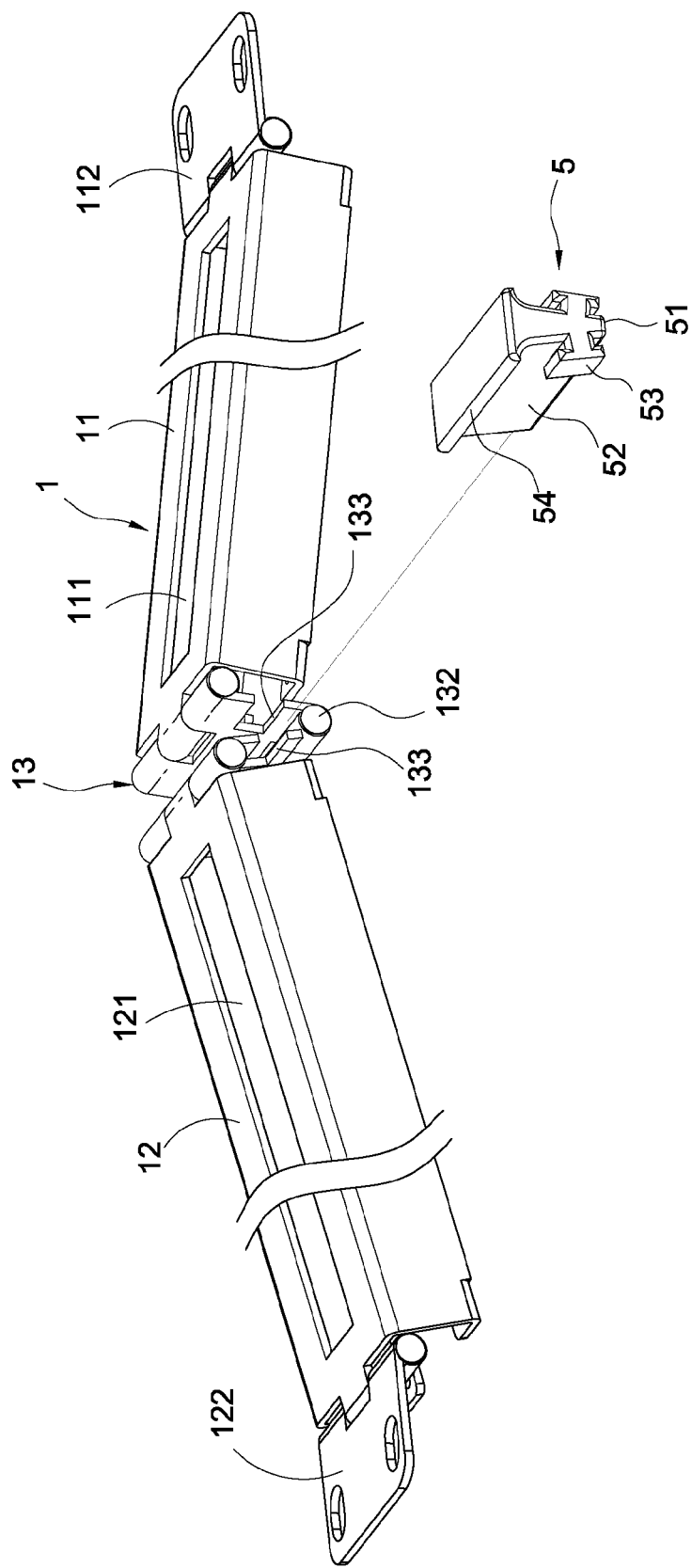
FIG. 8 is an exploded view of another embodiment of the present invention.
Figure 9:
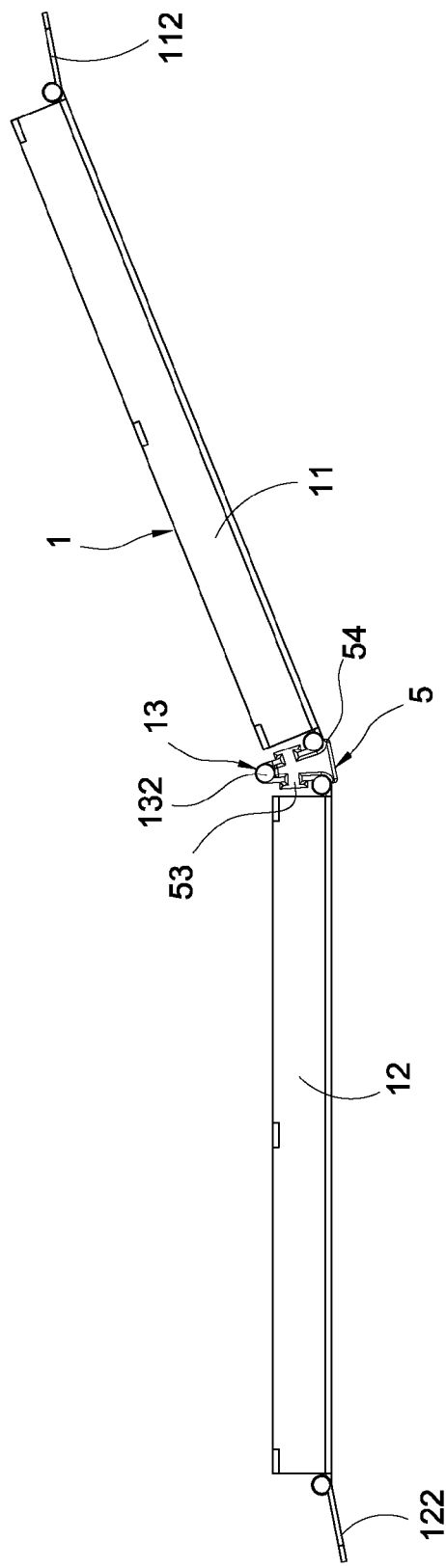
FIG. 9 is a perspective view of FIG. 6.

With reference to FIGS. 8 and 9 for an exploded view and a perspective view of a further preferred embodiment of the present invention, after the first panel 11 and the second panel 12 of the patch panel 1 are adjusted by the connecting plate 112, 122, and the two metal plates 131 of the hinge 13 are unfolded to an included angle equal to 15°, a triangular fixing element 5 made of rubber or plastic is used and the two metal plates 131 of the hinge 13 are unfolded to an included angle equal to 15°.

A cone 51 is protruded from a side of the fixing element 5, and a connecting area 52 is defined separately on both sides of the cone 51, and a T-shaped snap portion 53 is separately formed on the two connecting areas 52 and snapped into the two notches 133, and a stop wall 54 is separately formed on lateral edges of two connecting areas 52, and the connecting area 52 and the stop wall 54 are attached onto a side of the two metal plates 131 to limit the two metal plates 131 of the fixing element 5 at a fixed position.

Figure 10:
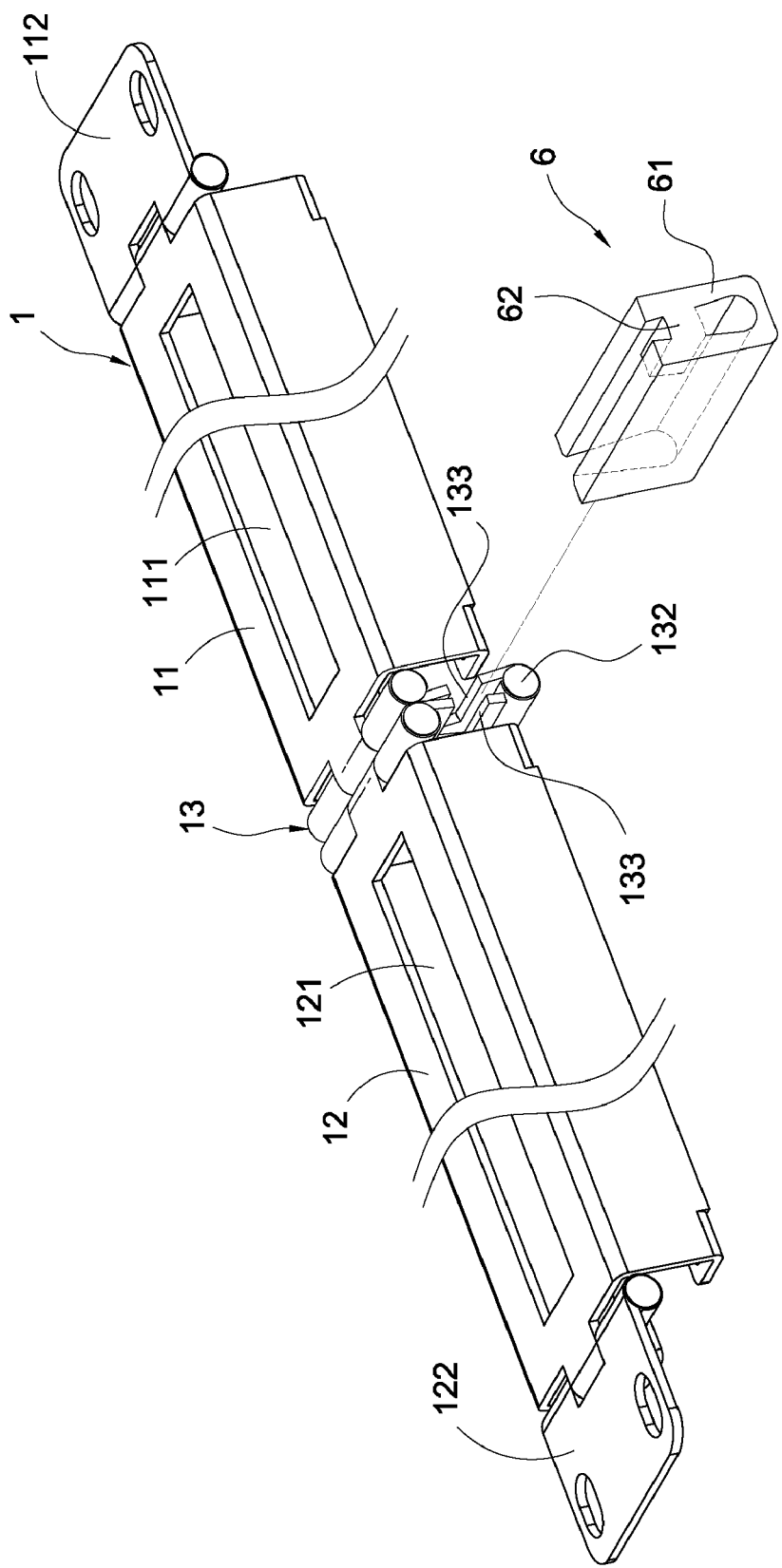
FIG. 10 is an exploded view of a further embodiment of the present invention.
Figure 11:
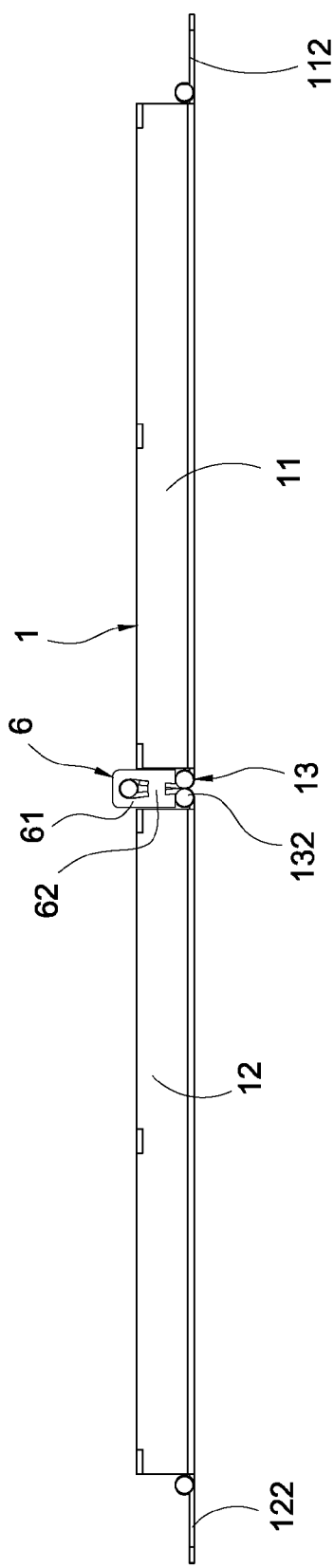
FIG. 11 is a perspective view of FIG. 10.

With reference to FIGS. 10 and 11 for an exploded view and a perspective view of another preferred embodiment of the present invention, the first panel 11 and the second panel 12 of the patch panel 1 are adjusted by using the connecting plates 112, 122, and the two metal plates 131 of the hinge 13 are installed parallel to each other and unfolded with a minimum included angle, a fixing element 6 with an A-shaped end and another U-shaped end is made of rubber or plastic, coupled to the two metal plates 131 of the hinge 13, and installed parallel to one another.

The fixing element 6 includes two side arms 61, a crossbeam 62 formed between ends of the two side arms 61, such that the fixing element 6 has an A-shaped end and another U-shaped end. After the two metal plates 131 are included by the two side arms 61 of the fixing element 6, the crossbeam 62 is installed across the two notches 133 to limit the two metal plates 131 of the fixing element 6 at a fixed position.

In summation of the description above, the present invention improves over the prior art and complies with the patent application requirements, and thus is duly filed for patent application. While the invention has been described by means of specific embodiments, numerous modifications and variations could be made thereto by those skilled in the art without departing from the scope and spirit of the invention set forth in the claims.

What is claimed is:

1. A bendable patch panel structure, installed on a chassis, and comprising:
   a patch panel, including a first panel and a second panel installed thereon, a hinge pivotally coupled to ends of the first panel and the second panel, and a connecting plate installed on the chassis and pivotally coupled to other ends of the first panel and the second panel; and
   a fixing element, installed and coupled to the hinge.

2. The patch panel structure of claim 1, wherein the first and second panels are long frame shaped panels, and each of the first and second panels has an opening formed thereon.

3. The patch panel structure of claim 2, wherein the hinge includes two metal plates and a plurality of pivots pivotally coupled to the two metal plates and the first and second panels, and each of the two metal plates has a notch formed thereon.

4. The patch panel structure of claim 3, wherein the fixing element is made of rubber or plastic and plate shaped, and includes a recession on formed a pivoting portion for containing the pivotally coupled two metal plates, and two connecting areas are defined on a side each of the two metal plates attached on both sides of the recession respectively, and each of the two connecting areas has a T-shaped snap portion snapped into the two notches of the two metal plates separately.

5. The patch panel structure of claim 4, wherein each of the two connecting areas has a stop wall formed on an edge of each connecting area, and the stop wall includes a recess formed thereon, and the stop wall and recess are coupled to the two metal plates and other pivoting portions of the first and second panels.

6. The patch panel structure of claim 3, further comprising a V-shaped fixing element installed on the hinge, if the two metal plates of the hinge are unfolded to an included angle equal to 30° (degrees).

7. The patch panel structure of claim 6, wherein the V-shaped fixing element is made of rubber or plastic and includes a V-shaped protrusion protruded from a side of the fixing element, a connecting area separately defined at both sides of the protrusion, a T-shaped snap portion separately formed on the two connecting areas and latched into the two notches, a stop wall separately formed on lateral edges of the two connecting areas, and the connecting area and the stop wall being attached onto a surface of the two metal plates.

8. The patch panel structure of claim 3, further comprising a triangular fixing element, if the two metal plates are unfolded to an included angle equal to 15° (degrees).

9. The patch panel structure of claim 8, wherein the triangular fixing element is made of rubber or plastic and includes a cone protruded from the fixing element, a connecting area separately defined at both sides of the cone, a T-shaped snap portion separately formed on the two connecting areas and latched into the two notches, a stop wall separately formed on lateral edges of the two connecting areas, and the connecting area and the stop wall being attached onto a surface of the two metal plates.

10. The patch panel structure of claim 3, wherein the two metal plates are installed parallel to each other, and coupled to a fixing element with an A-shaped end and another U-shaped end.

11. The patch panel structure of claim 3, wherein the fixing element is made of rubber or plastic, and includes two side arms formed thereon, and a crossbeam formed between ends of the two side arms, and the fixing element has an A-shaped end and another U-shaped end, and the two metal plates are included in the two side arms of the fixing element, and the crossbeam is coupled across the two notches.

* * * * *